United States Patent
Seo et al.

(10) Patent No.: US 6,858,919 B2
(45) Date of Patent: Feb. 22, 2005

(54) SEMICONDUCTOR PACKAGE (75) Inventors: Seong Min Seo, Seoul (KR); Young Suk Chung, Seoul (KR); Jong Sik Paek, Seoul (KR); Jae Hun Ku, Singapore (KR); Jae Hak Yee, Singapore (KR)

(73) Assignee: Amkor Technology, Inc., Chandler, AZ (US)

( * ) Notice: Subject to any disclaimer, the term of this patent is extended or adjusted under 35 U.S.C. 154(b) by 653 days.

(21) Appl. No.: 09/816,852

(22) Filed: Mar. 23, 2001

(65) Prior Publication Data

US 2002/0020907 A1 Feb. 21, 2002

(30) Foreign Application Priority Data

Mar. 25, 2000 (KR) ........................................ 2000-15304

(51) Int. Cl.[7] ........................ H01L 23/495; H01L 23/28
(52) U.S. Cl. ........................ 257/666; 257/670; 257/671; 257/788; 257/796
(58) Field of Search ........................ 257/666, 670, 257/788, 796

(56) References Cited

U.S. PATENT DOCUMENTS

| | | | |
|---|---|---|---|
| 3,833,984 A | 9/1974 | Crane et al. ............... | 29/193.5 |
| 4,530,152 A | 7/1985 | Roche et al. ............... | 29/588 |
| 4,707,724 A | 11/1987 | Suzuki et al. ............... | 357/71 |
| 4,756,080 A | 7/1988 | Thorp, Jr. et al. ............ | 29/827 |
| 4,812,896 A | 3/1989 | Rothgery et al. ............. | 357/70 |
| 5,041,902 A | 8/1991 | McShane ..................... | 357/79 |
| 5,157,480 A | 10/1992 | McShane et al. ............. | 357/74 |
| 5,172,213 A | 12/1992 | Zimmerman ................. | 257/796 |
| 5,172,214 A | 12/1992 | Casto ......................... | 257/676 |
| 5,200,362 A | 4/1993 | Lin et al. .................... | 437/207 |

(List continued on next page.)

FOREIGN PATENT DOCUMENTS

| | | | |
|---|---|---|---|
| DE | 197 34 794 | 8/1997 | .......... H01L/23/50 |
| EP | 794 572 A2 | 9/1997 | ......... H01L/23/495 |
| JP | 55-163868 | 12/1980 | .......... H01L/23/48 |
| JP | 57-45959 | 3/1982 | .......... H01L/23/28 |
| JP | 59-227143 | 12/1984 | .......... H01L/23/12 |
| JP | 60-195957 | 10/1985 | .......... H01L/23/48 |
| JP | 61-39555 | 2/1986 | .......... H01L/23/36 |
| JP | 62-9639 | 1/1987 | .......... H01L/21/56 |
| JP | 63-205935 | 8/1988 | .......... H01L/23/28 |
| JP | 63-233555 | 9/1988 | .......... H01L/23/30 |
| JP | 1-106456 | 4/1989 | .......... H01L/23/50 |
| JP | 5-335474 | * 12/1993 | ................. 257/666 |
| JP | 6-92076 | 4/1994 | .......... H01L/23/00 |
| JP | 06260532 A | 9/1994 | |
| JP | 7-312405 | 11/1995 | .......... H01L/23/50 |
| JP | 8-125066 | 5/1996 | .......... H01L/23/12 |
| JP | 8-306853 | 11/1996 | .......... H01L/23/50 |
| JP | 9-8205 | 1/1997 | .......... H01L/23/50 |
| JP | 9-8206 | 1/1997 | .......... H01L/23/50 |
| JP | 9-8207 | 1/1997 | .......... H01L/23/50 |
| JP | 9-92775 | 4/1997 | .......... H01L/23/50 |
| JP | 10199934 A | 7/1998 | |
| KR | 94-1979 | 1/1994 | .......... H01L/21/56 |
| KR | 97-72358 | 11/1997 | .......... H01L/23/50 |

*Primary Examiner*—Jasmine Clark
(74) *Attorney, Agent, or Firm*—Stetina Brunda Garred & Brucker (57) ABSTRACT

A semiconductor package is disclosed that bonds a semiconductor chip to a leadframe using a flip chip technology. An exemplary semiconductor package includes a semiconductor chip having a plurality of input-output pads at an active surface thereof. A plurality of leads are superimposed by the bond pads and active surface of the semiconductor chip. The leads have at least one exposed surface at a bottom surface of the package body. A plurality of conductive connecting means electrically connect the input-output pads of the chip to the leads. A package body is formed over the semiconductor chip and the conductive connecting means. The bottom surface portions of the leads are exposed to the outside.

16 Claims, 5 Drawing Sheets

U.S. PATENT DOCUMENTS

| | | | |
|---|---|---|---|
| 5,200,809 A | 4/1993 | Kwon | 257/707 |
| 5,214,845 A | 6/1993 | King et al. | 29/841 |
| 5,216,278 A | 6/1993 | Lin et al. | 257/688 |
| 5,221,642 A | 6/1993 | Burns | 437/207 |
| 5,258,094 A | 11/1993 | Furui et al. | 156/634 |
| 5,273,938 A | 12/1993 | Lin et al. | 437/207 |
| 5,277,972 A | 1/1994 | Sakumoto et al. | 428/355 |
| 5,278,446 A | 1/1994 | Nagaraj et al. | 257/707 |
| 5,279,029 A | 1/1994 | Burns | 29/856 |
| 5,332,864 A | 7/1994 | Liang et al. | 174/52.4 |
| 5,336,931 A | 8/1994 | Juskey et al. | 257/787 |
| 5,343,076 A | 8/1994 | Katayama et al. | 257/717 |
| 5,406,124 A | 4/1995 | Morita et al. | 257/783 |
| 5,424,576 A | 6/1995 | Djennas et al. | 257/666 |
| 5,435,057 A | 7/1995 | Bindra et al. | 29/830 |
| 5,521,429 A | 5/1996 | Aono et al. | 257/676 |
| 5,604,376 A | 2/1997 | Hamburgen et al. | 257/676 |
| 5,608,267 A | 3/1997 | Makulikar et al. | 257/796 |
| 5,639,990 A | 6/1997 | Nishihara et al. | 174/52.2 |
| 5,640,047 A | 6/1997 | Nakashima | 257/738 |
| 5,641,997 A | 6/1997 | Ohta et al. | 257/788 |
| 5,646,831 A | 7/1997 | Manteghi | 361/813 |
| 5,650,663 A | 7/1997 | Parthasarathi | 257/706 |
| 5,683,806 A | 11/1997 | Sakumoto et al. | 428/343 |
| 5,696,666 A | 12/1997 | Miles et al. | 361/764 |
| 5,701,034 A | 12/1997 | Marrs | 257/706 |
| 5,710,064 A | 1/1998 | Song et al. | 437/220 |
| 5,736,432 A | 4/1998 | Mackessy | 438/123 |
| 5,766,972 A | 6/1998 | Takahashi et al. | |
| 5,776,798 A | 7/1998 | Quan et al. | 438/112 |
| 5,783,861 A | 7/1998 | Son | 253/693 |
| 5,835,988 A | 11/1998 | Ishii | 257/684 |
| 5,859,471 A | 1/1999 | Kuraishi et al. | 257/666 |
| 5,866,939 A | 2/1999 | Shin et al. | 257/666 |
| 5,877,043 A | 3/1999 | Alcoe et al. | 438/123 |
| 5,894,108 A | 4/1999 | Mostafazadeh et al. | 174/52.4 |
| 5,977,613 A | 11/1999 | Takata et al. | 257/666 |
| 5,977,630 A | 11/1999 | Woodworth et al. | 257/712 |
| 5,981,314 A | 11/1999 | Glenn et al. | 438/127 |
| 6,001,671 A | 12/1999 | Fjelstad | 438/112 |
| 6,025,640 A | 2/2000 | Yagi et al. | 257/666 |
| 6,130,115 A | 10/2000 | Okumura et al. | 438/124 |
| 6,130,473 A | 10/2000 | Mostafazadeh et al. | 257/666 |
| 6,143,981 A | 11/2000 | Glenn | 174/52.4 |
| 6,198,171 B1 | 3/2001 | Huang et al. | 257/787 |
| 6,225,146 B1 | 5/2001 | Yamaguchi et al. | 438/123 |
| 6,229,200 B1 | 5/2001 | Mclellan et al. | 257/666 |
| 6,242,281 B1 | 6/2001 | Mclellan et al. | 438/106 |
| 6,281,568 B1 * | 8/2001 | Glenn et al. | 257/684 |
| 6,597,059 B1 * | 7/2003 | McCann et al. | 257/673 |
| 6,661,087 B2 * | 12/2003 | Wu | 257/692 |
| 2001/0013639 A1 * | 8/2001 | Abe | 257/666 |

* cited by examiner

SEMICONDUCTOR PACKAGE

BACKGROUND OF THE INVENTION

1. Field of the Invention

The present invention is in the field of semiconductor packaging.

2. Description of the Related Art

There are trends in semiconductor packaging towards packages that are highly functional, yet increasingly smaller in size so as to provide higher density in mounting. In keeping with these trends, semiconductor package 100 of FIG. 1 includes a semiconductor chip 2 which has a plurality of input-output pads 2a on a top, active surface 2b thereof. An opposite bottom, inactive surface 2c of chip 2 is bonded to a metal chip mounting substrate 4 by an adhesive 14.

Figure 1:
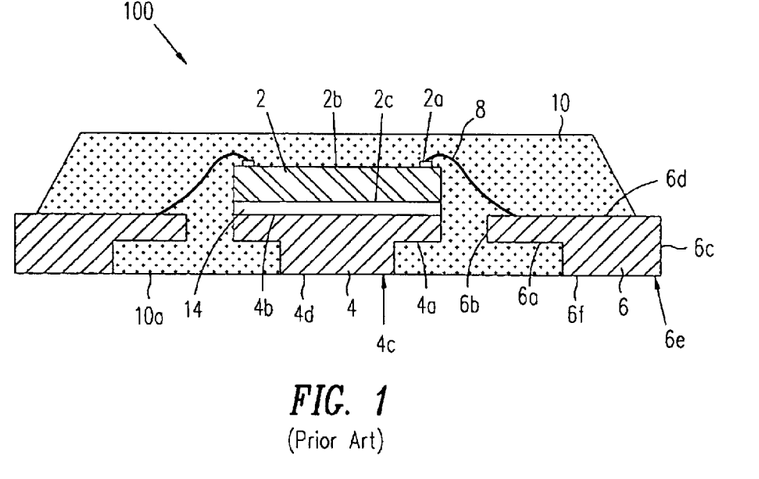
FIG. 1 is a cross-sectional side view of a conventional semiconductor package.

Chip mounting substrate 4 has a top first side 4b bonded to chip 2 by adhesive 14, and an opposite second side 4c. Second side 4c includes an exposed bottom central surface 4d. Second side 4c of chip mounting substrate 4 has been partially etched around central surface 4d so as to form a recessed horizontal surface 4a that fully surrounds and is vertically recessed from central surface 4c.

A plurality of horizontal metal leads 6 are arranged radially adjacent to and in the horizontal plane of chip mounting substrate 4. Leads 6 extend horizontally from an inner end 6b that faces chip mounting substrate 4 to an opposite outer end 6c. Each lead includes an upper first side 6d and an opposite lower second side 6e. Lower second side 6e includes an exposed surface portion, denoted as land 6f, that functions as an input/output terminal of package 100. Between inner end 6b and land 6f, lower second side 6e of each lead 6 includes a horizontal surface 6a that is vertically recessed from land 6f. Recessed surface 6a is formed by partially etching vertically through leads 6 from second side 6e.

Input-output pads 2a of semiconductor chip 2 and upper side 6d of leads 6a are electrically connected to each other by conductive wires 8.

Semiconductor chip 2, conductive wires 8, chip mounting substrate 4, and leads 6 are covered by an encapsulant material that forms a package body 10. Recessed horizontal surface 4a of chip mounting substrate 4 and recessed horizontal surface 6a of leads 6 are covered by encapsulant material of package body 10. Central surface 4a of chip mounting substrate 4 and land 6f of each lead 6 are exposed at a lower horizontal surface 10a of package body 10. Package 100 is mounted by fusing lands 6f, and possibly central surface 4c, to a mother board.

Semiconductor package 100 has several drawbacks, including a relatively large mounting height, due in part to the need to cover the apex of wires 8 with the encapsulant material. In addition, package 100 has a relatively large footprint, because a predetermined lateral space between the semiconductor chip and the leads is needed to accommodate the wire bonds.

Further, semiconductor package 100 has limited avenues for heat dissipation. The primary path of heat dissipation is through exposed central surface 4d of chip mounting substrate 4. Heat is also transferred to leads 6 through conductive wires 8, but conductive wires 8 are too small to effectively transfer the heat. Further, semiconductor chip 2 is completely covered by the encapsulant material, thereby limiting heat dissipation.

Semiconductor package 100 has a further disadvantage in that the input-output pads for the ground or power inputs of the semiconductor chip are connected to the leads by conductive wires 8. Accordingly, those leads are unavailable to transfer signals for chip 2.

Moreover, semiconductor package 100 requires a relatively large lead frame in order to accommodate the semiconductor chip's fine pitched input-output pads, thereby drastically degrading the mounting density on a mother board upon which package 100 is mounted.

SUMMARY OF THE INVENTION

The present invention provides semiconductor packages that can be made smaller than the conventional packages described above, so as to have a lesser mounting height and footprint, while providing increased functionality and reliability and improved thermal performance.

As an example, one embodiment of a semiconductor package in accordance with the present invention includes a plurality of horizontal metal leads. Each lead has a first side, and an opposite second side having at least one horizontal first surface and at least one horizontal second surface recessed from the first surface. The package further includes a chip mounting substrate having a first side and an opposite second side. The second side of the chip mounting substrate has a horizontal central surface and a horizontal peripheral surface fully around and recessed from the central surface. A semiconductor chip is mounted in a flip chip style on the first side of chip mounting substrate and the first side of the leads such that input-output pads at a peripheral portion of an active surface of the chip, and optional central input-output pads at a central portion of the active surface, face and are electrically connected to the first side of a respective one of the leads and the first side of the chip mounting substrate, respectively. A package body formed of a hardened encapsulating material covers the semiconductor chip, the recessed peripheral surface of the second side of the chip mounting substrate, and the recessed second surface of the second side of the leads. The central surface of the second side of the chip mounting substrate and the at least one first surface of the second side of the leads are exposed at a horizontal first exterior surface of the package body.

Optionally, a plurality of insulative layers may be provided, with each insulative layer being applied on the first side of the one of the leads or the first side of the chip mounting substrate. The electrical connections of the chip to the lead or the chip mounting substrate may be made through an opening in the respective insulative layer.

In addition, a surface of the semiconductor chip may be exposed through the package body, further increasing heat dissipation.

These and other aspects and features of the present invention will be better understood upon a reading of the following description of the exemplary embodiments and the drawings thereof.

BRIEF DESCRIPTION OF THE DRAWINGS

In the drawings, the same reference numbers are used for common features across the various drawings.

DETAILED DESCRIPTION

Various exemplary embodiments of the present invention will be described herein below with reference to the accompanying drawings. In the following description, well-known functions or constructions are not described in detail since to do so would obscure the invention in unnecessary detail.

Figure 2A:
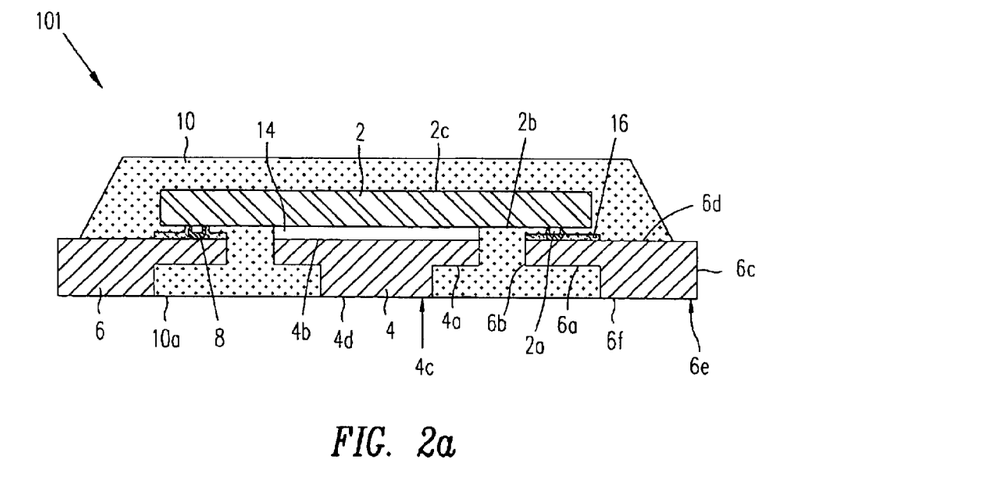
FIG. 2a and FIG. 2b are cross-sectional side views of a semiconductor package according to a first embodiment of the present invention.
Figure 2B:
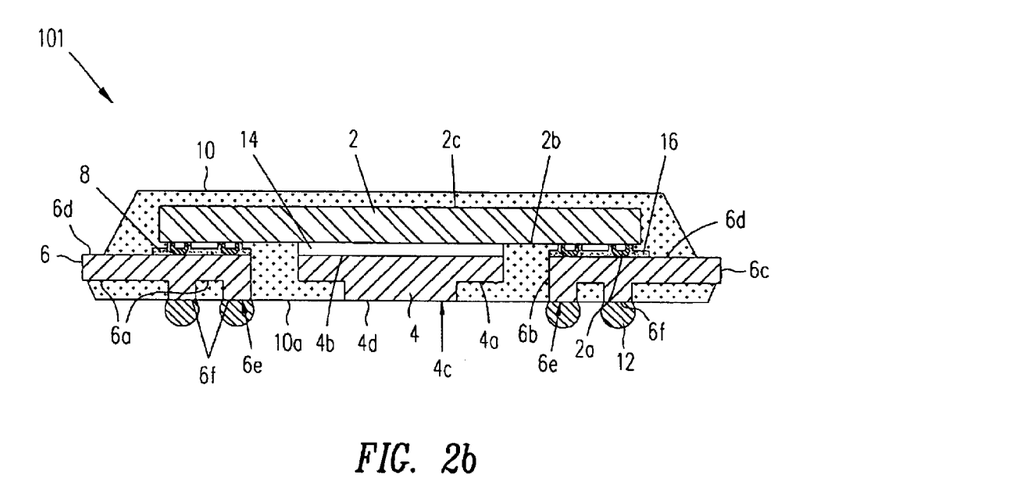

FIGS. 2a and 2b show a semiconductor package 101 according to a first embodiment of the present invention. Semiconductor package 101 includes many of the same features as package 100 of FIG. 1. Hence, our discussion focuses on differences between this embodiment (and those that follow) and the conventional package of FIG. 1.

Semiconductor package 101 includes a semiconductor chip 2, which has a plurality of peripheral input-output pads 2a along edges of active surface 2b. First side 4b of chip mounting substrate 4 is attached by an adhesive 14 to an open central portion of active surface 2b of chip 2 fully inside of peripheral input/output pads 2a. A plurality of leads 6 are placed about the peripheral line of chip mounting substrate 4, each spaced a selected lateral distance from the chip mounting substrate 4. In an alternative embodiment, chip mounting substrate 4 is omitted.

Chip mounting substrate 4 of FIG. 2a includes a recessed horizontal surface 4a that fully surrounds central surface 4d of bottom side 4c of chip mounting substrate 4. Lower second side 6e of each lead 6 includes a single recessed horizontal surface 6a that begins at inner end 6b of each lead 6 and extends only part of a distance toward outer second end 6c, thereby defining a land 6f at the lower side 6e of each lead 6.

Package 101 of FIG. 2b is similar to package 101 of FIG. 2a, except that the lower side 6e of each lead 24 includes at least two, laterally-spaced apart, recessed horizontal surfaces 6a, thereby defining two exposed lands 6f at lower side 6e of each lead 6. The exposed lands 6f are collectively arrayed in rows and columns at lower exterior surface 10a of package 101.

In FIGS. 2a and 2b, chip 2 is flipped relative to chip 2 of FIG. 1 such that active surface 2a of chip 2 faces chip mounting substrate 4 and leads 6. A heat conductive adhesive 14 is interposed between upper first surface 4b of chip mounting substrate 4 and active surface 2b of semiconductor chip 2, and thereby bonds semiconductor chip 2 to chip mounting substrate 4. The adhesive 14 is thermally conductive and electrically non-conductive, and transfers the heat of the semiconductor chip 2 to chip mounting substrate 4.

The peripheral input-output pads 2a of semiconductor chip 2 each face the upper side 6d of one of the leads 6 of package 101, and are electrically connected thereto by a conductive connecting means 8, such as a reflowed metal ball, e.g., of gold or solder, or an anisotropic conductive film, in a flip-chip style connection.

In the event that metal balls are used as the conductive connecting means 8, regions of upper side 6d around the area of connection with the respective conductive connecting means 8 may be coated with an optional insulating layer 16 of a prescribed thickness. Insulative layer 16 may be, for instance, a layer of solder mask, cover coat, or polyimide. Such an embodiment is described further below with respect to FIG. 5. With such an insulating layer, the respective conductive connecting means 8 is prevented from spreading outwardly during the reflow step, resulting in an easy fusing process.

In package 101 of FIGS. 2a and 2b, since the semiconductor chip 2 and the leads 6 are electrically and thermally connected with each other by the conductive connecting means 8, heat passes from chip 2 into the leads 6 through the conductive connecting means 8, and may be transferred to the air or to a mother board from the leads 6.

As mentioned, an anisotropic conductive film may be employed as the conductive connecting means 8, in place of a metal ball. Each anisotropic conductive film comprises an amalgamation of a conventional bonding film and conductive metal grains. A thickness of the bonding film is about 50 $\mu$m, and a diameter of each conductive metal grain is about 5 $\mu$m. A surface of the conductive metal grain is coated with a thin polymer layer. If heat or pressure is applied to a predetermined region of the anisotropic conductive film, the thin polymer layers of the conductive metal grains in the predetermined region are melted so that adjacent metal grains become connected, thereby providing electrical conductivity. The thin polymer layer of the remaining conductive metal grains, i.e., those not included in the predetermined region, are maintained in an insulated status. Therefore, a position setting operation between two component elements to be electrically connected can be implemented in an easy manner.

In a case where gold balls or solder balls (or other metal balls) are used as the conductive connection means 8, after the gold balls or solder balls are fused to predetermined regions of the semiconductor chip or the leads, a reflow process must be performed after a position setting operation in order to make an electrical connection. On the other hand, where the anisotropic conductive films are used as the conductive connection means 8, after the anisotropic conductive films are applied over relatively wide areas of the semiconductor chip or the leads, and the semiconductor chip and the leads are properly positioned with respect to each other, then the semiconductor chip and the leads can be electrically connected with each other by simply exerting a heating and/or pressing force of a desired level.

Accordingly, while it is illustrated in FIGS. 2a and 2b and the other drawings that metal balls are used as the conductive connection means 8, practitioners should understand that the metal balls can be replaced with anisotropic conductive films in all of the embodiments herein.

Using a flip chip style connection for electrically connecting semiconductor chip 2 to the superimposed upper surface 6d of leads 6 through a conductive connection means 8 eliminates the need for conductive wires, as in FIG. 1, thereby eliminating the need for package body 10 to cover the apex of the wire loops, and subsequently reducing the height of the semiconductor package.

Package body 10 of FIGS. 2a and 2b is formed by encapsulating the semiconductor chip 2, conductive connecting means 8, chip mounting substrate 4, optional insulating layer 16, and the leads 6 in an insulative encapsulating material. Package body 10 may be formed by molding and curing a resin material. The encapsulation is performed so that central surface 4d of lower side 4c of chip mounting substrate 4 and each land 6f of the leads 6 are exposed in the horizontal plane of exterior surface 10a of package body 10. On the other hand, recessed horizontal surfaces 4a and 6a are underfilled so as to be covered with the encapsulating material of package body 10, thereby improving the connection of chip mounting substrate 4 and leads 6 to package body 10 and preventing chip mounting substrate 4 and leads 6 from being vertically or horizontally from package body 10.

Semiconductor package 101 of FIG. 2a may be mounted on mother board by fusing solder between the land 6f of each lead 6 and metal terminals of the mother board. In the alternative embodiment of FIG. 2b, semiconductor package 101 may be mounted on the mother board after pre-fusing solder balls or other conductive balls 12 on exposed lands 6f. In such a configuration, a conductive paste or plurality of conductive balls may be provided on exposed central surface 4d of lower second side 4c of chip mounting substrate 4.

Figure 3A:
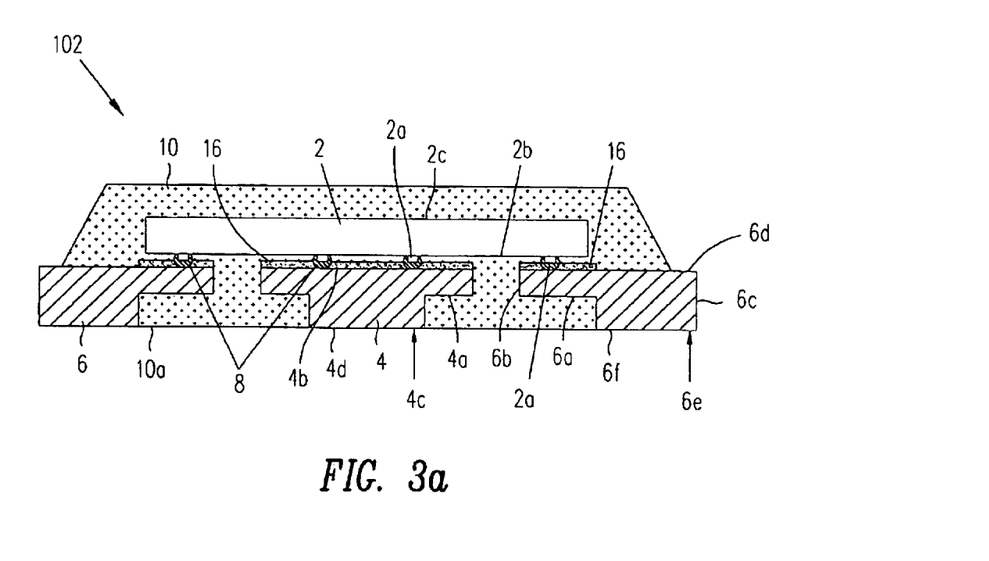
FIG. 3a and FIG. 3b are cross-sectional side views of a semiconductor package according to a second embodiment of the present invention.
Figure 3B:
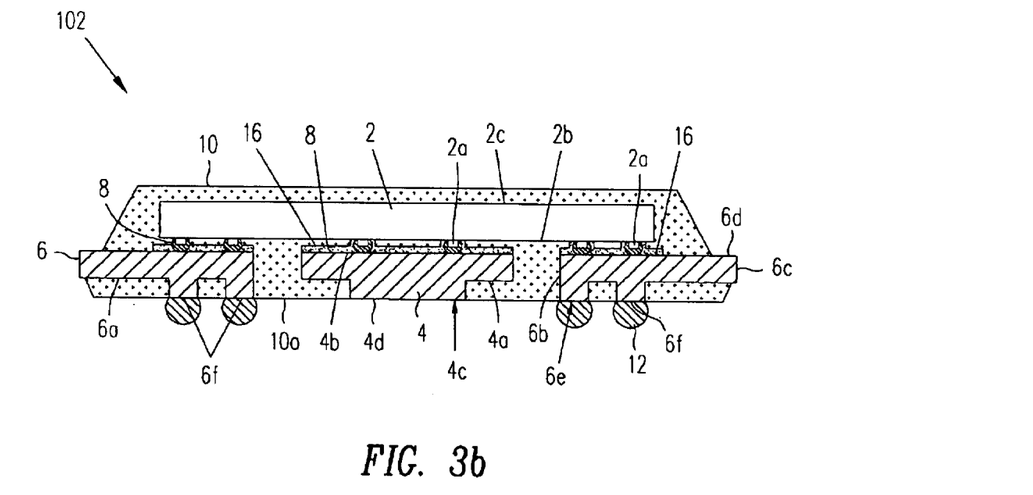

FIG. 3a and FIG. 3b show a semiconductor package 102 according a second embodiment of the present invention, which differs only slightly from semiconductor package 101 of FIGS. 2a and 2b. Accordingly, our discussion will focus on the differences between the packages.

In FIGS. 3a and 3b, semiconductor chip 2 includes a plurality of peripheral bond pads 2a along the edges of active surface 2b, and in addition includes at least one or a plurality of central bond pads 2a at a central portion of active surface 2a inward of the peripheral bond pads 2a. The central input-output pads 2a of chip 2 each face a portion of upper first side 4b of chip mounting substrate 4, and may be used for ground/power inputs to chip 2. The central input-output pads 2a are each electrically connected in a flip-chip style to the upper first side 4b of chip mounting substrate 4 by a conductive connecting means 8. First side 4b of chip mounting substrate 4 may be coated with an insulating layer 16 through which the conductive connecting means 8 extends, especially where means 8 is a metal ball, so that an electrical connection can be easily achieved. As described above, anisotropic films also can be used as the conductive connecting means 8 in package 102.

As stated above, since the input-output pads 2a for ground/power input are electrically connected in a flip-chip connection to the chip mounting substrate 4, more leads 6 of package 102 are available to carry signals to and from chip 2 without increasing the footprint of the package.

As with package 101, a conductive paste or a plurality of conductive balls may be provided on the exposed central surface 4d of lower side 4c of chip mounting substrate 4 of package 102 to improve heat transfer to the mother board.

Figure 4A:
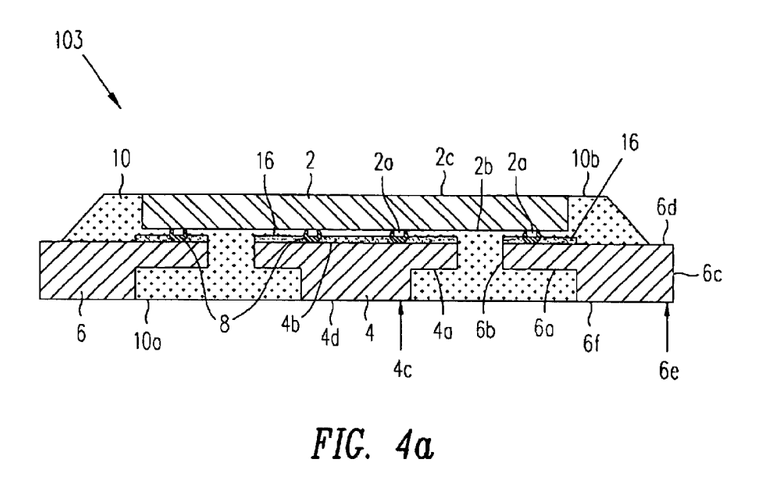
FIG. 4a and FIG. 4b are cross-sectional side views of a semiconductor package according to a third embodiment of the present invention.
Figure 4B:
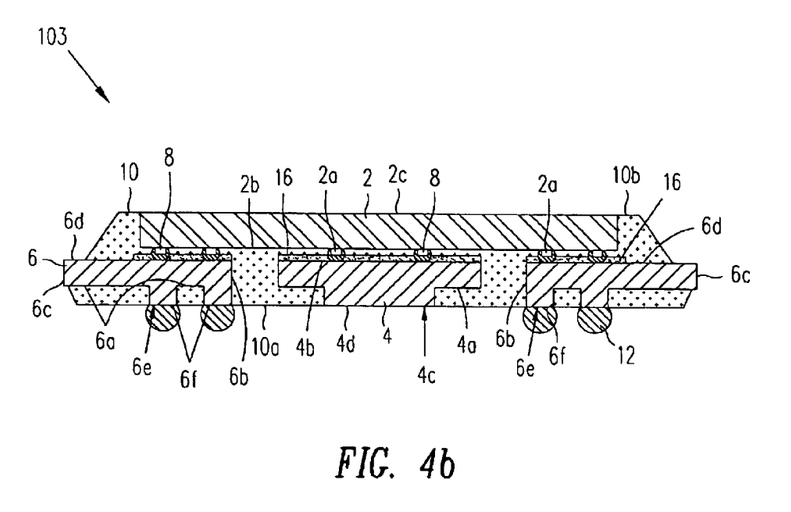

FIGS. 4a and 4b show a semiconductor package 103 according to a third embodiment of the present invention. Package 103 of FIGS. 4a and 4b is the same as package 102 of FIGS. 3a and 3b, except that inactive surface 2c of semiconductor chip 2 is exposed to the outside in the horizontal plane of upper exterior surface 10b of package body 10. Thus, heat generated in semiconductor chip 2 can be rapidly emitted to the outside through exposed inactive surface 2c, thereby enhancing the thermal performance of the package.

Figure 5:
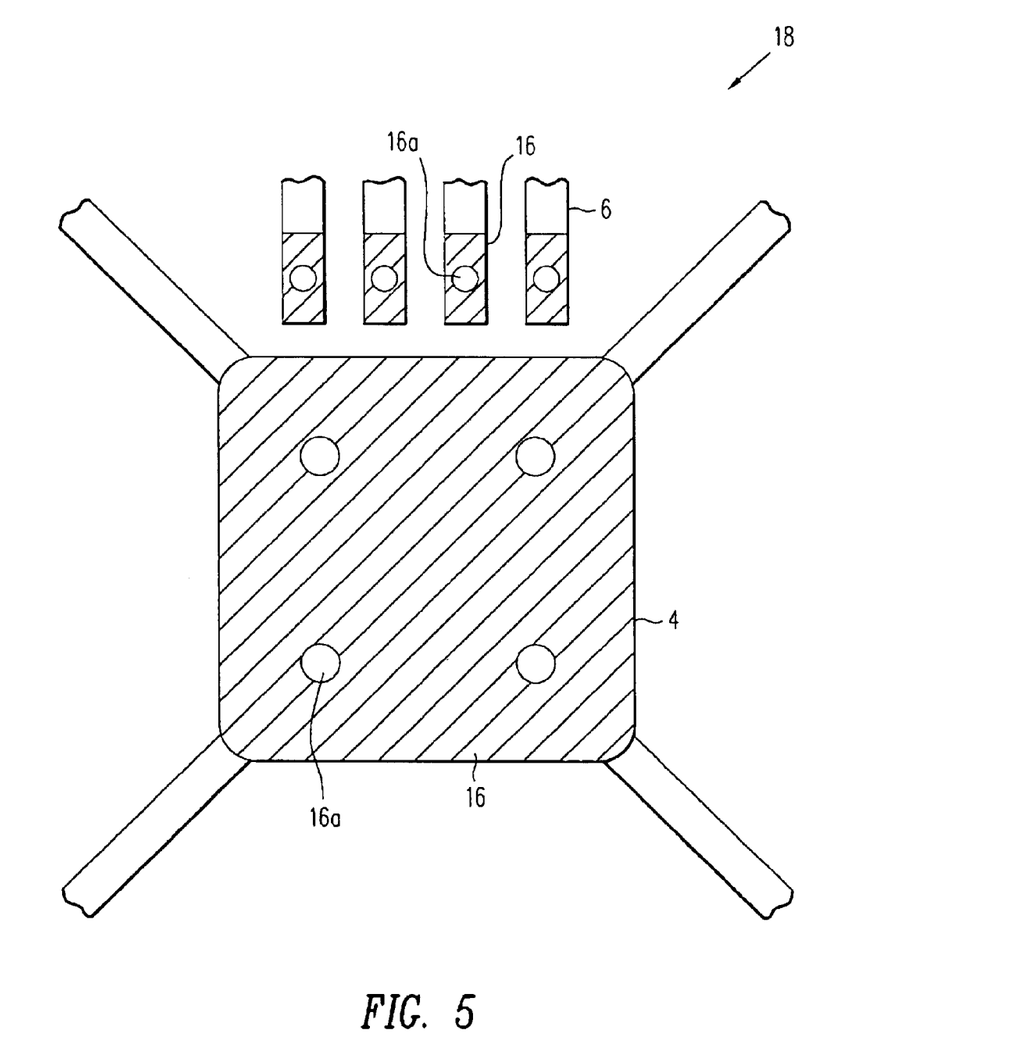
FIG. 5 is a top plan view of a portion of an embodiment of a leadframe for the packages of FIGS. 2a, 2b, 3a, 3b, 4a and 4b.

FIG. 5 is a plan view of a central portion of a leadframe 18 that may be used to make exemplary semiconductor packages 101, 102, and 103, typically where conductive connection means 8 is a metal ball. Leadframe 18 includes a chip mounting substrate 4, on which semiconductor chip 2 is to be mounted, and tie bars 20 that extend diagonally from respective corners of chip mounting substrate 4. Leads 6 are radially formed about the peripheral line of the chip mounting substrate 4. Practitioners will appreciate that the leads 6 typically will be provided adjacent to two or all four sides of chip mounting substrate 4.

Upper surface 4b of chip mounting substrate 4 is coated with an insulating layer 16. A plurality of openings 16a are formed through insulating layer 16 to expose portions of upper surface 4b of chip mounting substrate 4. A portion of upper first side 6d of each of the respective leads 6 is also coated with an insulating layer 16 beginning at inner end 66. An opening 16a exposes a portion of the upper side 6d of the respective lead 6. It is desirable that openings 16a are roughly formed in a flat and circular shape and are about the same diameter as the conductive connecting mean 8 (see FIG. 2a). The portions of upper surface 4b of chip mounting substrate 4 and upper first side 6d of leads 6 that are exposed through the openings 16a may be plated with gold (Au), silver (Ag), nickel (Ni), or palladium (Pd) for the purpose of facilitating a good bond with the conductive connecting means 8.

Conductive connecting means 8 are provided through the openings 16a, so that bond pads 2a of the semiconductor chip 2 can be electrically connected to leads 6, and in FIGS. 3a, 3b, 4a, and 4b to chip mounting substrate 4, in a flip-chip style. The conductive connecting means 8 extend through the respective opening 16a. Since the conductive connecting means 8 temporarily exists in a viscous state when connecting the semiconductor chip 2 and the chip mounting substrate 4 or the leads 6, the openings 16a act as a well protect the conductive connecting means in liquid form (e.g., reflowed metal) from being leaked to the outside.

Therefore, the semiconductor packages described herein eliminate the conductive wires of FIG. 1 by connecting the semiconductor chip and the leads in a flip-chip electrical connection through a conductive connecting means. Accordingly, the package is thinner and has a lower mounting height than package 100 of FIG. 1.

The semiconductor packages described herein can have another advantage of allowing a larger-sized semiconductor chip to be mounted on the same sized leadframe as in the prior art by obviating the need to design in space for conventional wire bonding.

The semiconductor packages described herein can have a further advantage of achieving enhancement in heat radiation by extending the effective heat radiation passageways to include the leads. In some embodiments, further enhancement in heat radiation is achieved by directly exposing the inactive surface of the semiconductor chip to the outside through the package body.

The semiconductor packages described herein can have still another advantage of securing the maximum number of leads for signal transfer by electrically connecting input-output pads of the chip to the chip mounting substrate by means of a conductive connecting means. The input-ouput pads so connected may be used as ground or power inputs.

The semiconductor packages described herein can have yet another advantage of protecting the conductive connecting means from being leaked to the outside and ensuring easy bonding when raising the conductive connecting means to the chip mounting substrate or the leads by providing a layer of an insulating material between the active surface of the chip and either the chip mounting substrate or the leads, and having the respective conductive connecting means extend through an opening in the respective insulating layer.

While the invention has been shown and described with reference to certain embodiments thereof, it will be understood by those skilled in the art that various changes in form and details may be made therein without departing from the spirit and scope of the invention as defined by the appended claims.

What is claimed is:

1. A semiconductor package comprising:
    a plurality of horizontal metal leads, each lead having a first side, and an opposite second side having at least one horizontal first surface and at least one horizontal second surface recessed from the first surface;
    a chip mounting substrate having a first side and an opposite second side, said second side having a horizontal central surface and a horizontal peripheral surface fully around and recessed from the central surface;
    a semiconductor chip having an active surface facing the first side of the leads and the first side of the chip mounting substrate, and input-output pads at a peripheral portion of the active surface, wherein each of the peripheral input-output pads faces and is electrically connected to the first side of a respective one of the leads; and
    a package body formed of a hardened encapsulating material, wherein the encapsulating material covers the semiconductor chip, the recessed peripheral surface of the second side of the chip mounting substrate, and the at least one recessed second surface of the second side of the leads, while the central surface of the second side of the chip mounting substrate and the at least one first surface of the second side of the leads are exposed at a horizontal first exterior surface of the package body.

2. The semiconductor package of claim 1, wherein the second side of each lead includes a plurality of the horizontal first surfaces and horizontal second surfaces, and the first surfaces of the leads collectively form rows and columns at the first exterior surface of the package body.

3. The semiconductor package of claim 1, wherein a surface of the semiconductor chip is exposed at an exterior surface of the package body.

4. The semiconductor package of claim 1, wherein the active surface of the semiconductor chip includes at least one central input-output pad inward of the peripheral input-output pads, and the at least one central input-output pad faces and is electrically connected to the first side of the chip mounting substrate.

5. The semiconductor package of claim 4, where the peripheral input-output pads and the at least one central input-output pad of the chip are each electrically connected to the first side of the lead or the first side of the chip mounting substrate, respectively, by a reflowed metal ball.

6. The semiconductor package of claim 5, further comprising a discrete insulative layer on the first side of each of the leads and the first side of the chip mounting substrate, wherein the insulative layer is covered by the encapsulating material and the respective reflowed metal ball extends through an opening in the respective insulative layer.

7. The semiconductor package of claim 4, where the peripheral input-output pads and the at least one central input-output pad of the chip are each electrically connected to the first side of the lead or the first side of the chip mounting substrate, respectively, by an anisotropic conductive film.

8. The semiconductor package of claim 1, where the peripheral input-output pads of the chip are each electrically connected to the first side of the respective lead by a reflowed metal ball.

9. The semiconductor package of claim 8, further comprising a discrete insulative layer on the first side of each of the leads, wherein the insulative layer is covered by the encapsulating material and the respective reflowed metal ball extends through an opening in the respective insulative layer.

10. The semiconductor package of claim 1, where the peripheral input-output pads of the chip are each electrically connected to the first side of the respective lead by an anisotropic conductive film.

11. The semiconductor package of claim 1, further comprising a conductive ball fused to each exposed first surface of the second side of the leads.

12. The semiconductor package of claim 2, further comprising a conductive ball fused to each exposed first surface of the second side of the leads.

13. The semiconductor package of claim 11, wherein a conductive paste or a plurality of conductive balls are on the central surface of the second side of the chip mounting substrate.

14. A semiconductor package comprising:
    a plurality of horizontal metal leads, each lead having a first side, and an opposite second side having at least one horizontal first surface and at least one horizontal second surface recessed from the first surface;
    a chip mounting substrate having a first side and an opposite second side, said second side having a horizontal central surface and a horizontal peripheral surface fully around and recessed from the central surface;
    a semiconductor chip in a flip chip electrical connection with the first side of the leads and the first side of the chip mounting substrate; and
    a package body formed of a hardened encapsulating material, wherein the encapsulating material covers the semiconductor chip, the recessed peripheral surface of the second side of the chip mounting substrate, and the recessed second surface of the second side of the leads, while the central surface of the second side of the chip mounting substrate and the at least one first surface of the second side of the leads are exposed at a horizontal first exterior surface of the package body.

15. The semiconductor package of claim 14, further comprising a discrete insulative layer on the first side of the leads and the first side of the chip mounting substrate, wherein the insulative layer is covered by the encapsulating material, and the chip is electrically connected to the first side of the respective lead and the first side of the chip mounting substrate through an opening in the respective insulating layer.

16. A semiconductor package comprising:
    a plurality of horizontal metal leads, each lead having a first side, and an opposite second side having at least one horizontal first surface and at least one horizontal second surface recessed from the first surface;
    a chip mounting substrate having a first side and an opposite second side, said second side having a horizontal central surface and a horizontal peripheral surface fully around and recessed from the central surface;
    a plurality of insulative layers, wherein a respective one of the insulative layers is on the first side of the leads and the first side of the chip mounting substrate;
    a semiconductor chip in a flip chip electrical connection with the first side of the leads and the first side of the chip mounting substrate through the respective insulative layer; and
    a package body formed of a hardened encapsulating material, wherein the encapsulating material covers the semiconductor chip and the insulative layers, the recessed peripheral surface of the second side of the chip mounting substrate, and the recessed second surface of the second side of the leads, while said central surface of the second side of the chip mounting substrate and the at least one first surface of the second side of the leads are exposed at a horizontal first exterior surface of the package body.

* * * * *